(12) United States Patent
Cai et al.

(10) Patent No.: US 12,538,671 B2
(45) Date of Patent: Jan. 27, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jianchang Cai, Beijing (CN); Zhiguo Deng, Beijing (CN); Biao Liu, Beijing (CN); Tinghua Shang, Beijing (CN); Jiaxing Chen, Beijing (CN); Yixuan Long, Beijing (CN); Zuoji Niu, Beijing (CN); Mingwen Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 526 days.

(21) Appl. No.: 18/020,645

(22) PCT Filed: Feb. 8, 2022

(86) PCT No.: PCT/CN2022/075443
§ 371 (c)(1),
(2) Date: Feb. 10, 2023

(87) PCT Pub. No.: WO2023/150902
PCT Pub. Date: Aug. 17, 2023

(65) Prior Publication Data
US 2024/0284727 A1 Aug. 22, 2024

(51) Int. Cl.
*H10K 59/131* (2023.01)
*H10K 59/121* (2023.01)
*H10K 59/65* (2023.01)

(52) U.S. Cl.
CPC ......... *H10K 59/131* (2023.02); *H10K 59/121* (2023.02); *H10K 59/65* (2023.02)

(58) Field of Classification Search
CPC ..... H10K 59/131; H10K 59/65; H10K 59/121
See application file for complete search history.

(56) References Cited

U.S. PATENT DOCUMENTS

| 2020/0052048 A1 | 2/2020 | Kuo et al. |
| 2020/0119107 A1* | 4/2020 | Liu ...................... H10K 59/353 |
| 2021/0294382 A1* | 9/2021 | Ma .......................... G06F 1/189 |

FOREIGN PATENT DOCUMENTS

| CN | 110265455 A | 9/2019 |
| CN | 113517324 A | 10/2021 |
| CN | 113990909 A | 1/2022 |
| EP | 3 944 225 A1 | 1/2022 |

* cited by examiner

*Primary Examiner* — Robert J Michaud
(74) *Attorney, Agent, or Firm* — XSENSUS LLP

(57) ABSTRACT

Described are a display panel and a display device. The display panel includes a base substrate provided with a first display region and a second display region; a plurality of first pixel circuit groups arrayed in the second display region, wherein each of the first pixel circuit groups includes one first pixel circuit and at most six second pixel circuits, and the first pixel circuit and the at most six second pixel circuits arranges along a row direction of the display panel; a plurality of first light-emitting elements disposed in the first display region; a plurality of second light-emitting elements disposed in the second display region; and a plurality of connection traces extending along the row direction.

20 Claims, 8 Drawing Sheets

☐  first light-emitting element 103

▨  second light-emitting element 104

○ first light-emitting element 103    ▨ third light-emitting element 107

● second light-emitting element 104

DISPLAY PANEL AND DISPLAY DEVICE

This application is a U.S. national stage of international application No. PCT/CN2022/075443, filed on Feb. 8, 2022, the content of which is herein incorporated by reference in its entirety.

TECHNICAL FIELD

The present disclosure relates to the field of display technologies and particularly relates to a display panel and a display device.

BACKGROUND

Organic light-emitting diode (OLED) display panels are widely used due to their advantages of self-luminescence, low drive voltage, and fast response speed. An OLED display panel generally includes a plurality of pixel units, each including a light-emitting element and a pixel circuit connected to the light-emitting element.

SUMMARY

The present disclosure provides a display panel and a display device. The technical solutions are as follows.

In one aspect, a display panel is provided. The display panel includes:
- a base substrate provided with a first display region and a second display region, wherein the second display region at least partially surrounds the first display region;
- a plurality of first pixel circuit groups arrayed in the second display region, wherein each of the first pixel circuit groups includes one first pixel circuit and at most six second pixel circuits, and the first pixel circuit and the at most six second pixel circuits arranges along a row direction of the display panel;
- a plurality of first light-emitting elements disposed in the first display region;
- a plurality of second light-emitting elements disposed in the second display region, wherein the plurality of second light-emitting elements are in one-to-one correspondence with the second pixel circuits in the plurality of first pixel circuit groups, and each second light-emitting element is connected to one of the second pixel circuits corresponding to the second light-emitting element; and
- a plurality of connection traces extending along the row direction, wherein one end of each of the connection traces is disposed in the first display region and connected to one of the first light-emitting elements, and the other end of each of the connection traces is disposed in the second display region and connected to the first pixel circuit of one of the first pixel circuit groups.

In some embodiments, each of the first pixel circuit groups includes an even number of the second pixel circuits.

In some embodiments, the second pixel circuit in each of the first pixel circuit groups includes a plurality of first-type second pixel circuits and a plurality of second-type second pixel circuits;
wherein a number of the first-type second pixel circuits is the same as a number of the second-type second pixel circuits, and for each first pixel circuit group, the first pixel circuit is disposed between the plurality of first-type second pixel circuits and the plurality of second-type second pixel circuits.

In some embodiments, the base substrate is further provided with a third display region, and the third display region is disposed on a side, distal from the first display region, of the second display region; and the display panel further includes:
- a plurality of second pixel circuit groups disposed in the third display region, wherein the second pixel circuit groups includes third pixel circuits; and
- a plurality of third light-emitting elements disposed in the third display region, wherein the plurality of third light-emitting elements are in one-to-one correspondence with the third pixel circuits in the plurality of second pixel circuit groups, and each third light-emitting element is connected to one of the third pixel circuits corresponding to the third light-emitting element;
- wherein a number of the third pixel circuits included by each of the second pixel circuit groups is the same as a number of the first-type second pixel circuits included by one of the first pixel circuit groups.

In some embodiments, a color of light emitted from the third light-emitting element connected to the third pixel circuit included by the second pixel circuit group is the same as a color of light emitted from the second light-emitting element connected to the first-type second pixel circuit included by one of the first pixel circuit groups; or
the color of the light emitted by the third light-emitting element connected to the third pixel circuit included by the second pixel circuit group is the same as a color of the light emitted by the second light-emitting element connected to the second-type second pixel circuit included by one of the first pixel circuit groups.

In some embodiments, the third display region is stripe-shaped, and extends along a column direction of the display panel.

In some embodiments, each of the first pixel circuit groups includes four of the second pixel circuits.

In some embodiments, the first display region is disposed in a middle of the substrate base in the row direction; the second display region includes a first sub-region and a second sub-region; the first sub-region and the second sub-region are disposed on both sides of the first display region in the row direction respectively;
wherein, in the plurality of first pixel circuit groups, a number of one row of first pixel circuit groups disposed in the first sub-region is the same as a number of one row of first pixel circuit groups disposed in the second sub-region.

In some embodiments, the plurality of connection traces include a plurality of first-type connection traces and a plurality of second-type connection traces;
one end of each first-type connection trace connected to the first pixel circuit is disposed in the first sub-region, and one end of each second-type connection trace connected to the first pixel circuit is disposed in the second sub-region;
wherein the plurality of first connection traces and the plurality of second connection traces are in one-to-one correspondence, and a length of each first connection trace along the row direction is equal to a length of the second connection trace corresponding to the first connection trace along the row direction.

In some embodiments, the first pixel circuit of a target first pixel circuit group in the plurality of first pixel circuit groups is configured to be connected to a power supply terminal for supplying a power supply signal of a fixed voltage to the first pixel circuit;

wherein the first pixel circuit of the target first pixel circuit group is not connected to the first light-emitting element.

In some embodiments, the first light-emitting element includes a first electrode, a light-emitting pattern, and a second electrode which are sequentially stacked in a direction away from the base substrate; and one end of each of the connection traces disposed in the first display region is connected to the first electrode in one first light-emitting element.

In some embodiments, the display panel further includes: a plurality of first connection structures and a plurality of second connection structures, wherein the plurality of first connection structures are disposed in the first display region and the plurality of second connection structures are disposed in the second display region;

wherein the plurality of first connection structures and the plurality of second connection structures are all disposed on a same layer as the plurality of connection traces, the end, disposed in the first display region, of each of the connection traces is connected to the first electrode in one of the first light-emitting elements by one of the first connection structures, and the other end, disposed in the second display region, of each of the connection traces is connected to the first pixel circuit in one of the first pixel circuit groups by one of the second connection structures.

In some embodiments, for each connection trace, one first connection structure connected to the connection trace, one second connection structure connected to the connection trace, and the connection trace are integrated.

In some embodiments, the display panel further includes a plurality of third connection structures, the plurality of third connection structures being disposed in the second display region; the second light-emitting element includes a first electrode, a light-emitting pattern, and a second electrode which are sequentially stacked in a direction away from the base substrate; and the plurality of third connection structures and the plurality of connection traces are disposed on a same layer, and the first electrode in each second light-emitting element is connected to one of the second pixel circuits by one of the third connection structures.

In some embodiments, the connection trace is made of transparent conductive material.

In some embodiments, the transparent conductive material is indium tin oxide.

In some embodiments, the plurality of connection traces include a plurality of first layer connection traces and a plurality of second layer connection traces; the display panel further includes: an insulating layer between the plurality of first layer connection traces and the plurality of second layer connection traces; and among the plurality of first light-emitting elements, a part of the first light-emitting elements are connected to the first layer connection traces, and the other part of the first light-emitting elements are connected to the second layer connection traces.

In some embodiments, orthographic projections of the plurality of first layer connection traces onto the substrate base are alternately arranged with orthographic projections of the plurality of second layer connection traces onto the substrate base.

In another aspect, a display device is provided, including a photosensitive element, and the display panel as defined in any one of above embodiments;

wherein the photosensitive element is disposed in the first display region of the display panel.

In some embodiments, the photosensitive element is a camera.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description illustrate merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, to increase a screen-to-body ratio of a display panel, a camera of a display device is disposed in a display region of the display panel. In order to increase the transmittance of a region in which the camera is disposed, a pixel circuit of each pixel unit in a region in which the camera is disposed is usually provided in a non-camera region. The pixel circuit in the non-camera region is connected to a light-emitting element in the camera region by the connection trace, such that a driving signal is supplied to the light-emitting element in the camera region.

However, since the length of the connection trace between each pixel circuit in the non-camera region and the light-emitting element in the camera region is long, the reliability of signal transmission is low, resulting in a poor display effect of the display panel.

Figure 1:
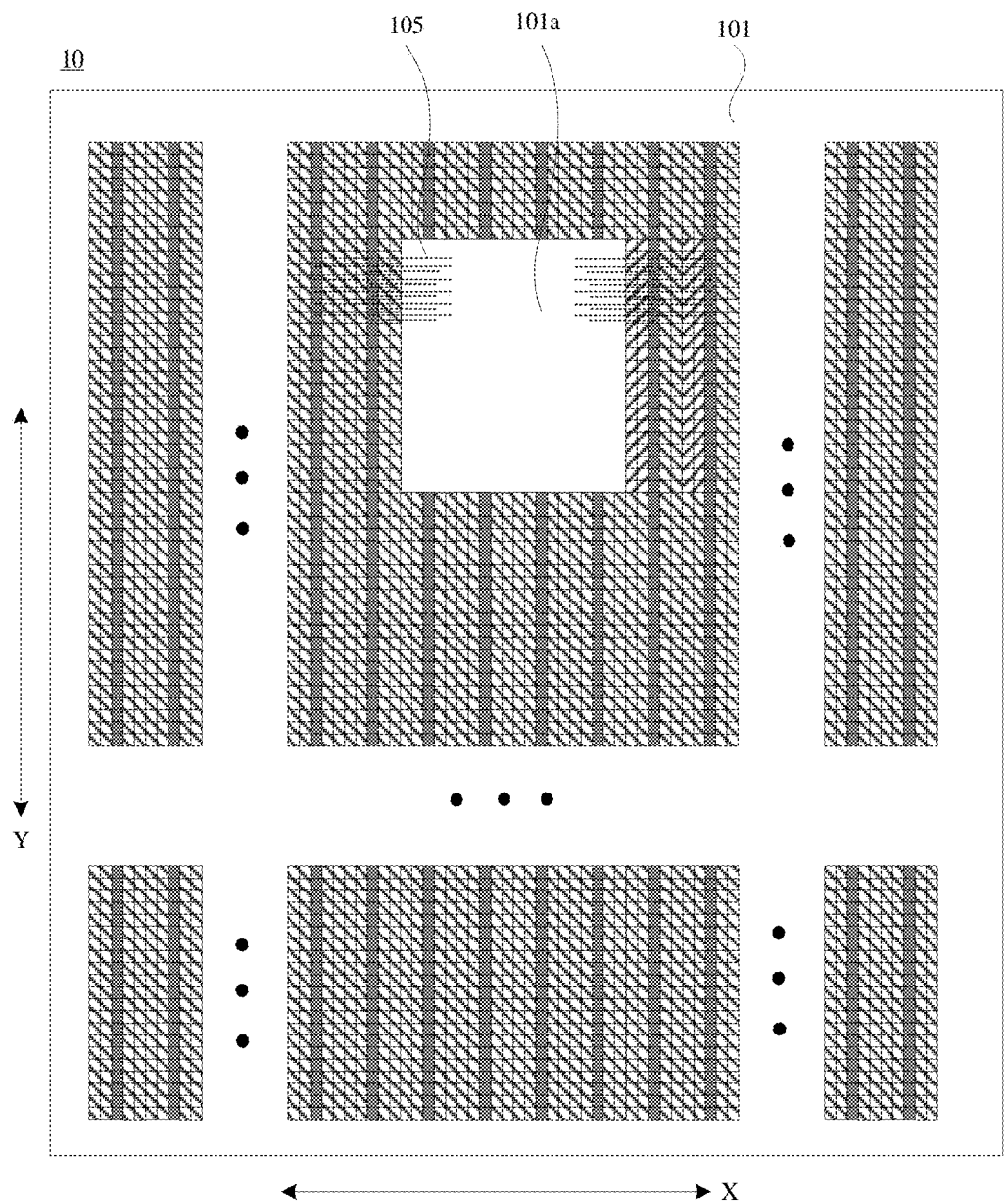
FIG. 1 is a schematic layout diagram of a pixel circuit in a display panel according to some embodiments of the present disclosure.
Figure 2:
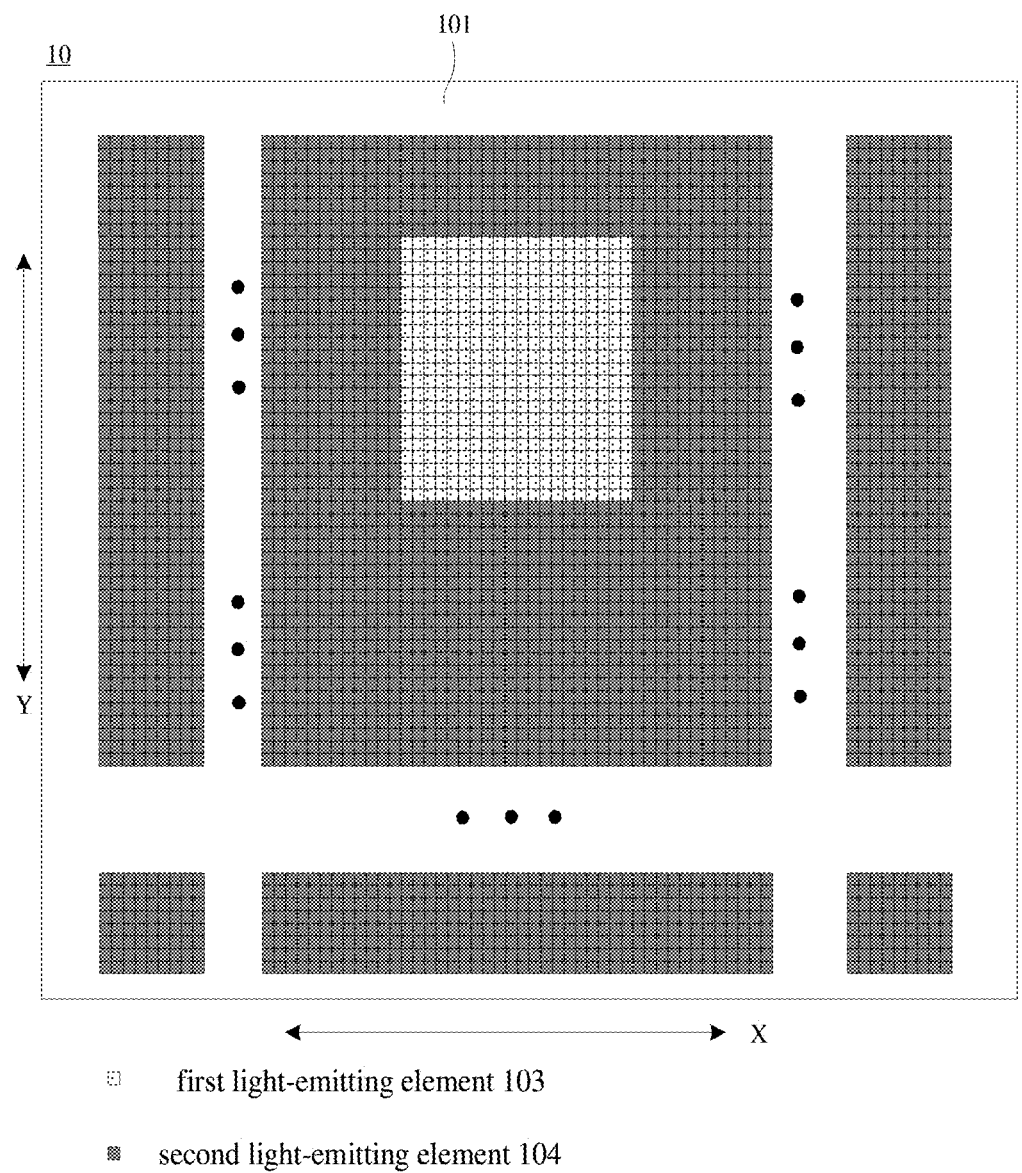
FIG. 2 is a schematic layout diagram of light-emitting elements in a display panel according to some embodiments of the present disclosure.

FIG. 1 is a schematic layout diagram of a pixel circuit in a display panel according to some embodiments of the present disclosure. FIG. 2 is a schematic layout diagram of light-emitting elements in a display panel according to some embodiments of the present disclosure. Referring to FIGS. 1 and 2, the display panel 10 includes: a substrate 101, a plurality of first pixel circuit groups 102, a plurality of first light-emitting elements 103, a plurality of second light-emitting elements 104 and a plurality of connection traces 105.

Figure 3:
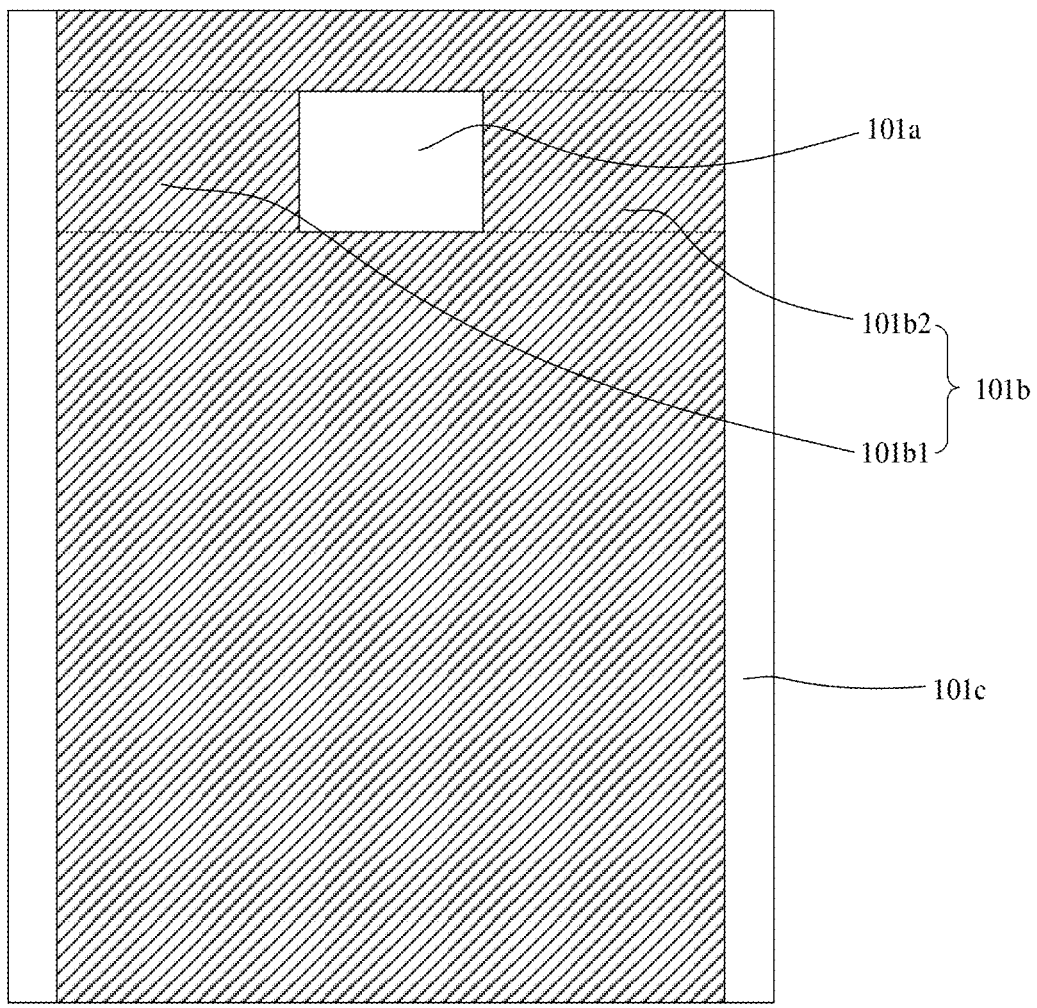
FIG. 3 is a top view of a base substrate according to some embodiments of the present disclosure.

FIG. 3 is a top view of a base substrate according to some embodiments of the present disclosure. Referring to FIG. 3, the base substrate 101 is provided with a first display region 101a and a second display region 101b, and the second display region 101b at least partially surrounds the first display region 101a.

Referring to FIG. 1 and FIG. 3, the display panel 10 includes the plurality of first pixel circuit groups 102 arranged in an array in the second display region 101b, and each of the first pixel circuit groups 102 includes one first pixel circuit 1021 and at most six second pixel circuits 1022. The first pixel circuit 1021 and at most six second pixel circuits 1022 are arranged along the row direction X of the display panel 10.

For example, each of the first pixel circuit groups 102 in FIG. 1 includes four second pixel circuits 1022. Alternatively, the number of the second pixel circuits 1022 included in each of the first pixel circuit groups 102 is related to the arrangement of the sub-pixels of different colors in the display panel 10. The display panel 10 generally includes red (R), green (G) and blue (B) sub-pixels. Each sub-pixel is constituted by one pixel circuit and one light-emitting element.

Referring to FIGS. 1 to 3, a plurality of second light-emitting elements 104 are disposed in the second display region 101b. The plurality of second light-emitting elements 104 are in one-to-one correspondence with the second pixel circuits 1022 in the plurality of first pixel circuit groups 102, and each second light-emitting element 104 is connected to one of the second pixel circuits 1022 corresponding to the second light-emitting element 104, thereby causing the second pixel circuit 1022 to supply the driving signal to the corresponding second light-emitting element 104. That is, the number of second light-emitting elements 104 included by the display panel 10 is the same as the number of second pixel circuits 1022 included by the display panel 10, and the second light-emitting elements 104 are in one-to-one correspondence with the second pixel circuits 1022. Each sub-pixel disposed in the second display region 101b is constituted by one second pixel circuit 1022 and one corresponding second light-emitting element 104.

In addition, the plurality of first light emitting elements 103 in the display panel 10 are disposed in the first display region 101a. The plurality of connection traces 105 extend along the row direction X of the display panel 10. One end of each connection trace 105 is disposed in the first display region 101a and connected to one of the first light-emitting elements 103, and the other end of each connection trace 105 is disposed in the second display region 101b and connected to the first pixel circuit 1021 in one of the first pixel circuit groups 102. That is, the first pixel circuit 1021 in the second display region 101b is connected to the first light-emitting element 103 in the first display region 101a via the connection trace 105, such that the first pixel circuit 1021 supplies the driving signal to the first light-emitting element 103.

The number of the connection traces 105 included in the display panel 10 is equal to the number of the first light-emitting elements 103 included in the display panel 10. That is, the plurality of connection traces 105 and the plurality of first light-emitting elements 103 correspond to each other one by one. In addition, the display panel 10 includes the number of the first pixel circuits 1021 to be larger than the number of the first light-emitting elements 103 included in the display panel 10.

In some embodiments of the present disclosure, since each of the first pixel circuit groups 102 includes at most six second pixel circuits 1022, one first pixel circuit 1021 for supplying the driving signal to the first light-emitting element 103 in the first display region 101a can be provided in the region of every at most six second pixel circuits 1022 in the second display region 101b. Therefore, the length of the connection trace 105 connecting to the first pixel circuit 1021 and the first light-emitting element 103 can be made shorter, thereby improving the reliability of signal transmission of the connection trace 105 and ensuring the display effect of the display panel 10.

In summary, the embodiments of the present provide a display panel in which each first pixel circuit group includes at most six second pixel circuits for supplying the driving signal to the second light-emitting elements in the second display region, such that one first pixel circuit for supplying the driving signal to the first light-emitting elements in the first display region can be provided in the region of every at most six second pixel circuits in the second display region. Therefore, the length of the connection trace for connecting the first pixel circuit and the first light-emitting element can be shorter, thereby improving the reliability of the connection trace for transmitting signals and ensuring the display effect of the display panel.

In some embodiments, the connection trace 105 is made of transparent conductive material, which can avoid the influence of the connection trace 105 on the transmittance of the first display region 101a, and the first pixel circuit 1021 is enabled to supply the driving signal to the first light-emitting element 103 by the connection trace 105. For example, the transparent conductive material is an Indium Tin Oxide (ITO).

In some embodiments of the present disclosure, each of the first pixel circuit groups 102 includes an even number of the second pixel circuits 1022. For example, each of the first pixel circuit groups 102 includes two second pixel circuits 1022, or includes four second pixel circuits 1022, or includes six second pixel circuits 1022. In some embodiments, each of the first pixel circuits 102 includes an odd number of the second pixel circuits 1022, which is not limited in the embodiments of the present disclosure.

Figure 4:
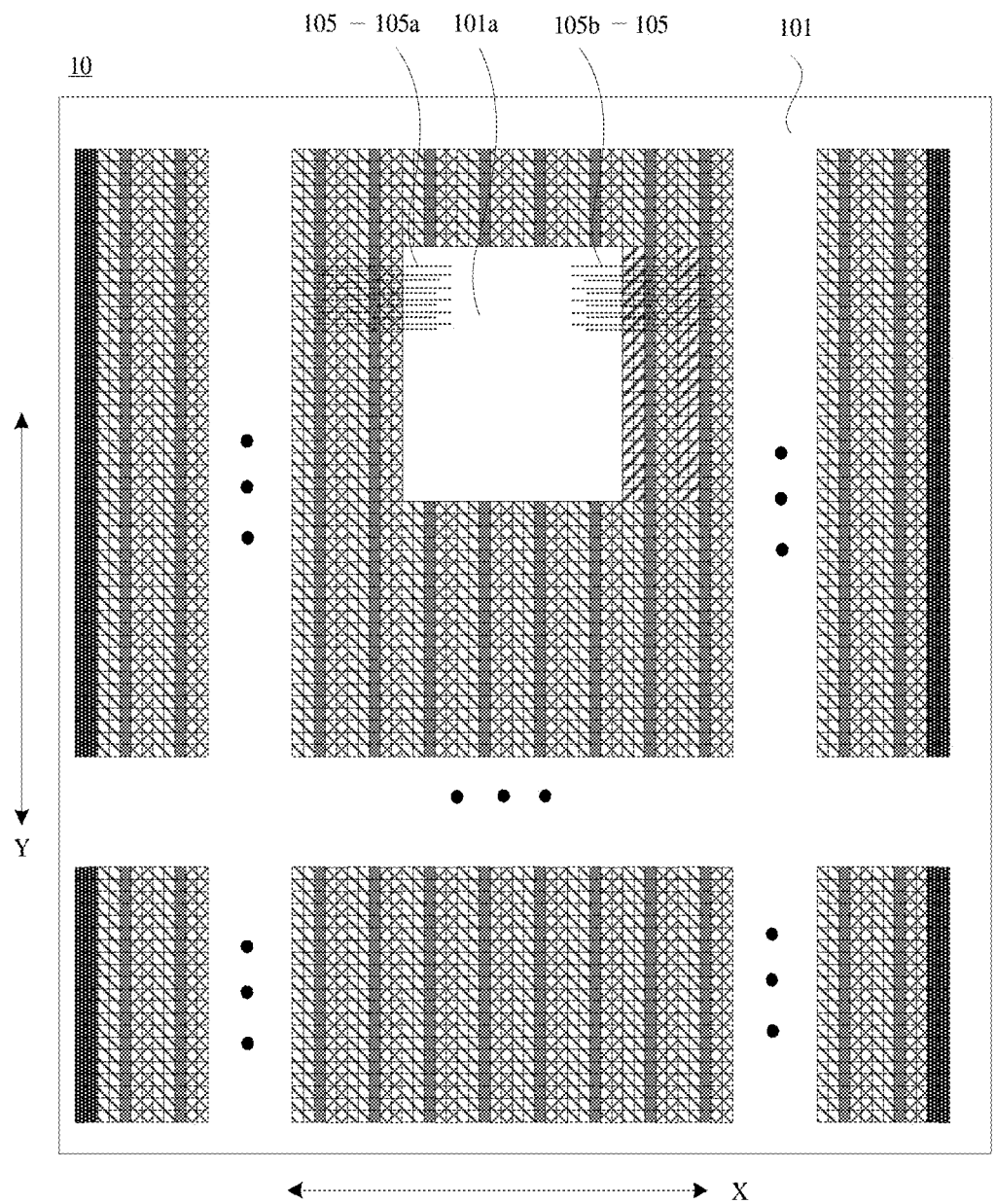
FIG. 4 is a schematic layout diagram of a pixel circuit in another display panel according to some embodiments of the present disclosure.
Figure 5:
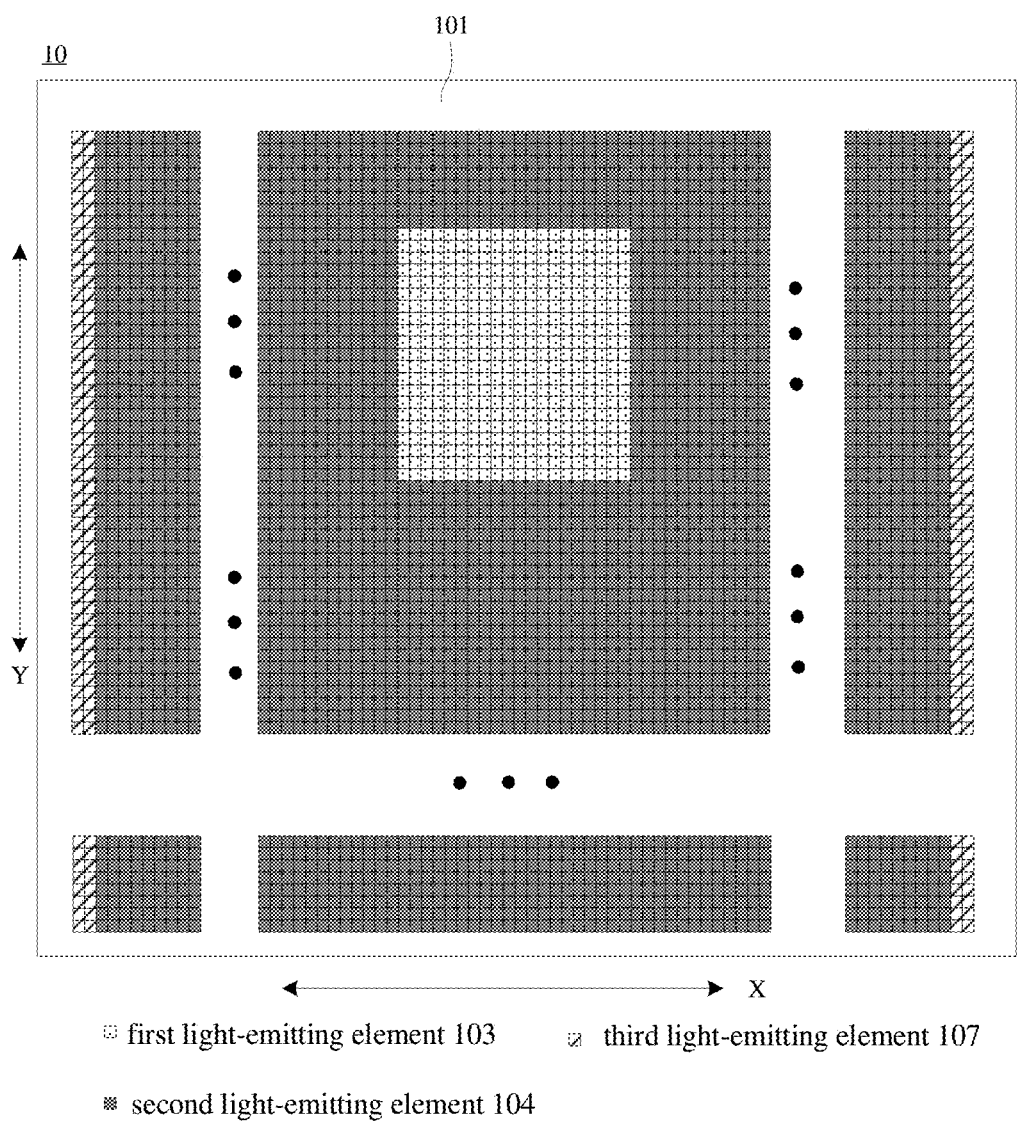
FIG. 5 is a schematic layout diagram of light-emitting elements in another display panel according to some embodiments of the present disclosure.

Referring to FIG. 4, it can be seen that a second pixel circuit 1022 in each first pixel circuit group 102 includes: a plurality of first-type second pixel circuits 1022a and a plurality of second-type second pixel circuits 1022b. The number of the first-type second pixel circuits 1022a is the same as the number of the second-type second pixel circuits 1022b. For each first pixel circuit group 102, the first pixel circuits 1021 in the first pixel circuit group 102 are disposed between the plurality of first-type second pixel circuits 1022a and the plurality of second-type second pixel circuits 1022b. That is, in each of the first pixel circuit groups 102, the first pixel circuit 1021 is disposed at the middle position of all pixel circuits included in the first pixel circuit group 102.

Since the first pixel circuits 1021 for supplying the driving signal to the first light-emitting elements 103 are arranged at the middle position, it is convenient to make lengths of the connection traces 105 connecting to the first pixel circuits 1021 in a first sub-region 101*b*1 on the left side of the first display region 101*a* in the second display region 101*b* and the lengths of the connection traces 105 connecting to the first pixel circuits 1021 in a second sub-region 101*b*2 on the right side of the first display region 101*a* in the second display region 101*b* correspondingly the same. Therefore, the symmetry of the plurality of connection trace 105 included in the display panel 10 is better, thereby avoiding poor display of the display panel 10.

Exemplarily, the first pixel circuit group 102 of FIG. 4 includes four second pixel circuits 1022. The four second pixel circuits 1022 include two first-type second pixel circuits 1022*a* and two second-type second pixel circuits 1022*b*. In some embodiments, in the case that the first pixel circuit group 102 includes six second pixel circuits 1022, the six second pixel circuits 1022 include three first-type second pixel circuits 1022*a* and three second-type second pixel circuits 1022*b*. In the case that the first pixel circuit group 102 includes two second pixel circuits 1022, the two second pixel circuits 1022 include one first-type second pixel circuit 1022*a* and one second-type second pixel circuit 1022*b*.

In some embodiments of the present disclosure, referring to FIG. 3, the base substrate 101 is further provided with a third display region 101*c*, and the third display region 101*c* is disposed on a side, distal from the first display region 101*a*, of the second display region 101*b*. The display panel 10 further includes a plurality of second pixel circuit groups 106 and a plurality of third light-emitting elements 107 in a third display region 101*c*. The second pixel circuit group 106 includes a third pixel circuit 1061. The plurality of third light-emitting elements 107 are in one-to-one correspondence with the third pixel circuits 1061 in the plurality of second pixel circuit groups 106, and each third light emitting element 107 is connected to one of the third pixel circuits 1061 corresponding to the third light emitting element 107, such that the third pixel circuit 1061 supplies the driving signal to the corresponding third light-emitting element 107.

The number of third pixel circuits 1061 included in each second pixel circuit group 106 is the same as the number of the first-type second pixel circuits 1022*a* included in one first pixel circuit group 102.

Arrangement of the pixel circuits in regions in the display panel 10 where the pixel circuits are provided are the same. In the case that the third display region 101*c* (the display region proximal to the boundary) of the display panel 10 has a small size in the row direction X and is difficult to set with the first pixel circuit group 102 as a minimum repeating unit, the second pixel circuit group 106 is set as the minimum repeating unit.

Arrangement of the third pixel circuits 1061 included in the second pixel circuit group 106 corresponds to the arrangement of the first-type second pixel circuits 1022*a* included in the first pixel circuit group 102, or corresponds to the arrangement of the second-type second pixel circuits 1022*b* included in the first pixel circuit group 102, which is based on whether the second pixel circuit group 106 is disposed in the third display region 101*c* on the left side of the second display region 101*b* or in the third display region 101*c* on the right side of the second display region 101*b*.

Exemplarily, in the case that the second pixel circuit group 106 is disposed in the third display region 101*c* on the left side of the second display region 101*b*, the arrangement of the third pixel circuits 1061 included in the second pixel circuit group 106 corresponds to the arrangement of the second-type second pixel circuits 1022*b* included in the first pixel circuit group 102. In the case that the second pixel circuit group 106 is disposed in the third display region 101*c* on the right side of the second display region 101*b*, the arrangement of the third pixel circuits 1061 included in the second pixel circuit group 106 corresponds to the arrangement of the first second pixel circuits 1022*a* included in the first pixel circuit group 102.

The arrangement of the third pixel circuits 1061 included in the second pixel circuit group 106 corresponds to the arrangement of the second-type second pixel circuits 1022*a* included in the first pixel circuit group 102, which is used to indicate: the color of the light emitted by the third light-emitting element 107 connected to the third pixel circuit 1061 included in the second pixel circuit group 106 is the same as the color of the light emitted by the second light-emitting element 104 connected to the second-type second pixel circuit 1022*b* included in one of the first pixel circuit groups 102. That is, the color of a sub-pixel defined by the third pixel circuit 1061 and the third light-emitting element 107 connected thereto corresponds to the same color as the sub-pixel defined by the second-type second pixel circuit 1022*b* and the second light-emitting element 104 connected thereto.

The arrangement of the third pixel circuits 1061 included in the second pixel circuit group 106 corresponds to the arrangement of the first-type second pixel circuits 1022*a* included in the first pixel circuit group 102, which is used to indicate: the color of the light emitted by the third light-emitting element 107 connected to the third pixel circuit 1061 included in the second pixel circuit group 106 is the same as the color of the light emitted by the second light-emitting element 104 connected to the first-type second pixel circuit 1022*a* included in one of the first pixel circuit groups 102. That is, the color of the sub-pixel defined by the third pixel circuit 1061 and the third light-emitting element 107 connected thereto corresponds to the same color as the sub-pixel defined by the first-type second pixel circuit 1022*a* and the second light-emitting element 104 connected thereto.

Figure 6:
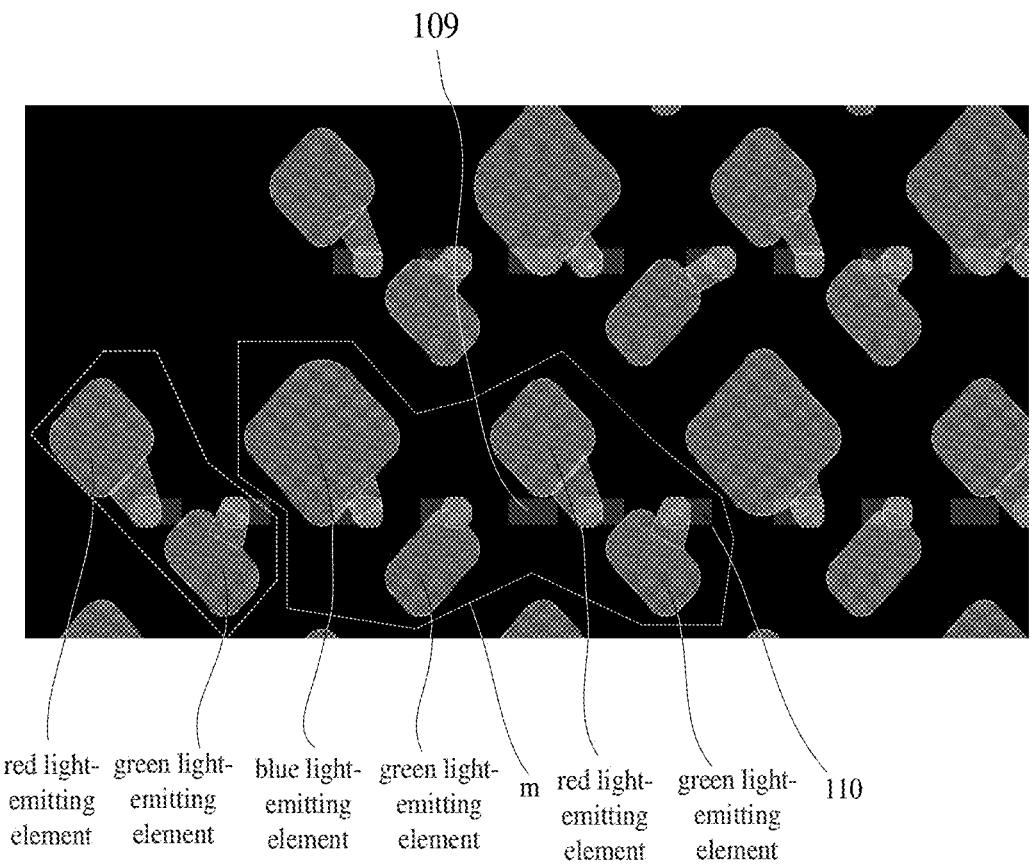
FIG. 6 is a schematic diagram of a portion of a display panel according to some embodiments of the present disclosure.
Figure 7:
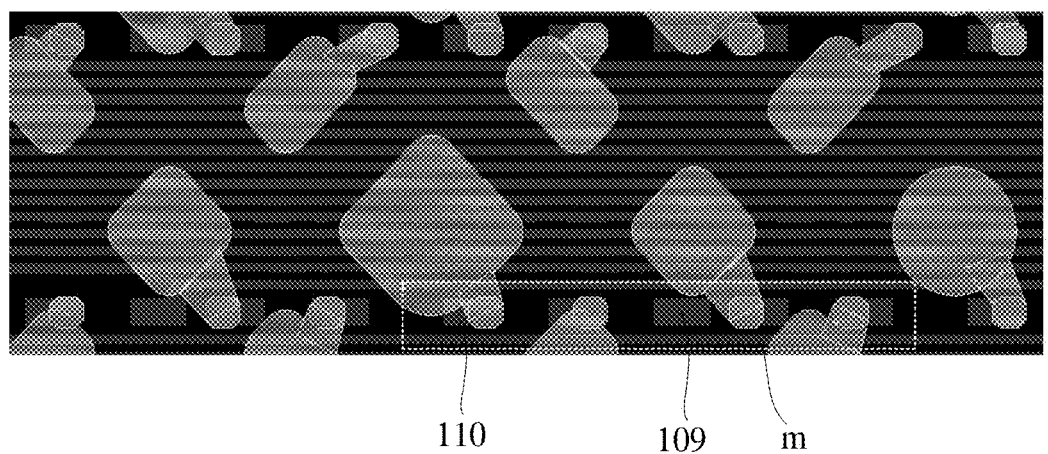
FIG. 7 is a schematic diagram of a portion of another display panel according to in some embodiments of the present disclosure.

Exemplarily, the first pixel circuit group 102 includes two first-type second pixel circuits 1022*a* and two second-type second pixel circuits 1022*b*. Accordingly, referring to FIGS. 6 and 7, each minimum repeating unit m includes, from left to right, two second light-emitting elements 104 connected to two first-type second pixel circuits 1022*a*, and two second light-emitting elements 104 connected to two second-type second pixel circuits 1022*b*. Referring to FIG. 6, the four second light-emitting elements 104 are a blue light-emitting element, a green light-emitting element, a red light-emitting element and a green light-emitting element from left to right. A second pixel circuit group 106 includes two third pixel circuits 1061 corresponding to the two second-type second pixel circuits 1022*b*, and the two third light-emitting elements 107 connected to the two third pixel circuits 1061 are respectively a red light-emitting element and a green light-emitting element. The blue light emitting element and a pixel circuit connected to the blue light-emitting element form a blue sub-pixel, the green light-emitting element and the pixel circuit connected to the green light-emitting element form a green sub-pixel, and the red light-emitting element and the pixel circuit connected to the red light-emitting element form a red sub-pixel. FIG. 6 indicates only anodes of the light-emitting elements, and does not indicate light-emitting patterns and cathodes of the light-emitting elements.

Since the first pixel circuits 1021 in the first pixel circuit group 102 are disposed in the middle of all the pixel circuits included in the first pixel circuit group 102, in the case that the third display region 101c of the display panel 10 can place the same number of third pixel circuits 1061 as the first-type second pixel circuits 1022a (or the second-type second pixel circuits 1022b) in the first pixel circuit group 102, the second pixel circuit group 106 does not include dummy pixel circuits corresponding to the first pixel circuits 1021. The dummy pixel circuit refers to a pixel circuit which is not connected to any light-emitting element.

That is, the third display region 101c of the display panel 10 has a smaller size along the row direction X, and only the third pixel circuits 1061 (the third pixel circuits 1061 corresponds to the first-type second pixel circuits 1022a, or corresponds to the second-type second pixel circuits 1022b) is reserved, and the dummy pixel circuits (corresponding to the first pixel circuits 1021) are not required to be reserved. Therefore, more space is reserved in a peripheral region of the base substrate 101 to facilitate setting of other devices in the peripheral region in the display panel 10. In FIG. 6, the second pixel circuit group 106 does not include the dummy pixel circuit by not illustrating a connection structure corresponding to the dummy pixel circuit, and the first pixel circuit group 106 includes the first pixel circuit 1061 by illustrating a connection structure 109 corresponding to the first pixel circuit 1061.

In some embodiments of the present disclosure, the third display region 101c is in a stripe shape, and extends along the column direction Y of the display panel 10. In the case that four corners of the second display region 101b are curved, the third display region 101c is also curved. The embodiments of the present disclosure do not limit the shape of the third display region 101c.

In some embodiments of the present disclosure, the first display region 101a is disposed in the middle of the base substrate 101 along the row direction X. The second display region 101b includes a first sub-region 101b1 and a second sub-region 101b2, and the first sub-region 101b1 and the second sub-region 101b2 are respectively disposed on both sides of the first display region 101a along the row direction X. For example, the first sub-region 101b1 of the second display region 101b is disposed on the left of the first display region 101a, and the second sub-region 101b2 of the second display region 101b is disposed on the right of the first display region 101a.

Since the first display region 101a is disposed in the middle of the base substrate 101 along the row direction X, the area of the first sub-region 101b1 is the same as the area of the second sub-region 101b2. Thus, the number of the first pixel circuit groups 102 that can be provided along the row direction X in the first sub-region 101b1 can be equal to the number of the first pixel circuit groups 102 that can be provided along the row direction X in the second sub-pixel. That is, among the plurality of first pixel circuit groups 102, the number of one row of the first pixel circuit groups 102 disposed in the first sub-region 101b1 is the same as the number of one row of the first pixel circuit groups 102 disposed in the second sub-region 101b2.

In some embodiments of the present disclosure, the plurality of connection traces 105 includes: a plurality of first-type connection traces 105a and a plurality of second-type connection traces 105b. One end of each first-type connection trace 105a connected to the first pixel circuit 1021 is disposed in the first sub-region 101b1, and one end of each second-type connection trace 105b connected to the first pixel circuit 1021 is disposed in the second sub-region 101b2. The plurality of first connection traces 105a and the plurality of the second connection traces 105b are in one-to-one correspondence, and the length of each first connection trace 105a along the row direction X is equal to the length of the corresponding second connection trace 105b along the row direction X.

Figure 8:
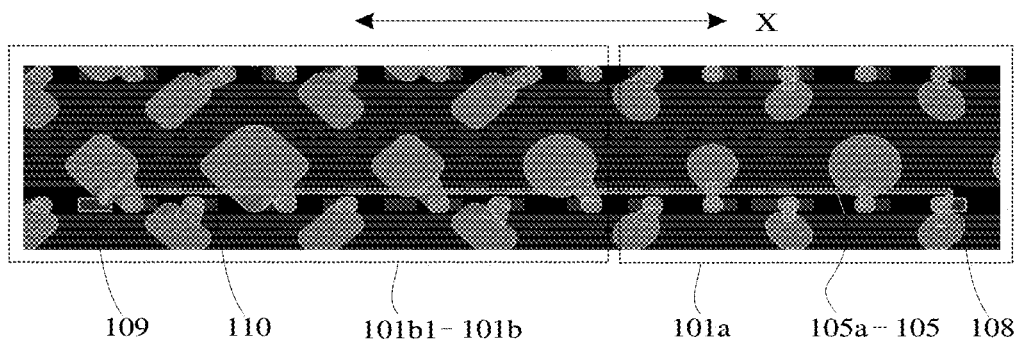
FIG. 8 is a schematic diagram of a portion of another display panel according to some embodiments of the present disclosure.
Figure 9:
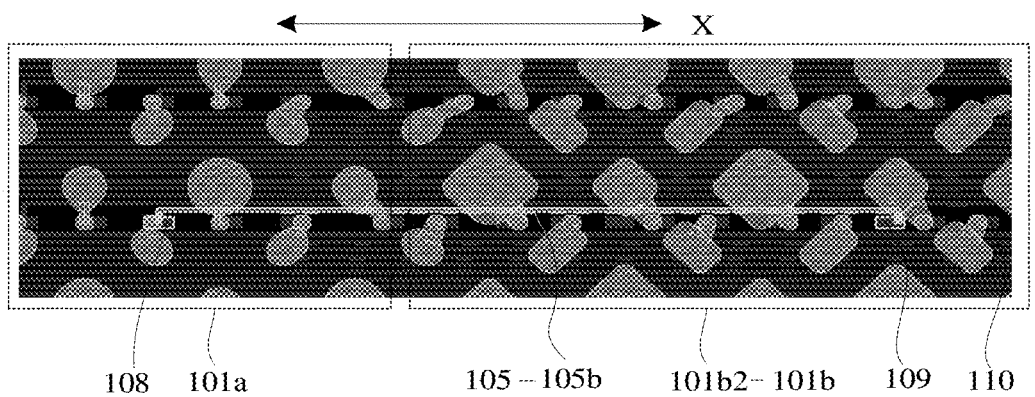
FIG. 9 is a schematic diagram of a portion of another display panel according to some embodiments of the present disclosure.

Exemplarily, FIG. 8 is a partial schematic diagram of a first sub-region and a first display region provided in some embodiments of the present disclosure, and FIG. 9 is a partial schematic diagram of a second sub-region and a first display region provided in some embodiment of the present disclosure. Referring to FIGS. 8 and 9, the length of the firs-type connection trace 105a along the row direction X is equal to the length of the corresponding second-type connection trace 105b along the row direction X.

Since the length of each first-type connection trace 105a along the row direction X is equal to the length of the corresponding second-type connection trace 105b along the row direction X, thereby ensuring the symmetry of the plurality of connection traces 105 included in the display panel 10 and ensuring the display effect of the display panel 10.

In some embodiments of the present disclosure, the first pixel circuit 1021 of a target first pixel circuit group in the plurality of first pixel circuit groups 102 is configured to be connected to a power supply terminal, which is configured to supply a power supply signal of a fixed voltage to the first pixel circuit 1021 of the target first pixel circuit group. The first pixel circuit 1021 of the target first pixel circuit group is not connected to the first light-emitting element 103.

Exemplarily, the power supply terminal is the power supply terminal of a positive power supply signal, and is used to supply the positive power supply signal to the first pixel circuit 1021 in the target first pixel circuit group. The positive power supply signal is also referred to as a VDD signal.

The first pixel circuit 1021 of the target first pixel circuit group is not connected to the first light-emitting element 103, and the first pixel circuit 1021 of the target first pixel circuit group is referred to as a dummy pixel circuit. In the case that the power supply signal of the fixed voltage is not supplied to the dummy pixel circuit by the power supply terminal, a change of the signal in the dummy pixel circuit may cause influence to the normal operation of other pixel circuits. Therefore, in the embodiments of the present disclosure, the power supply terminal supplies the power supply signal of the fixed voltage to the dummy pixel circuits, such that the signal in the dummy pixel circuit can be prevented from changing, the normal operation of other pixel circuits in the display panel 10 can be ensured, and the display effect of the display panel 10 can be ensured.

Figure 10:
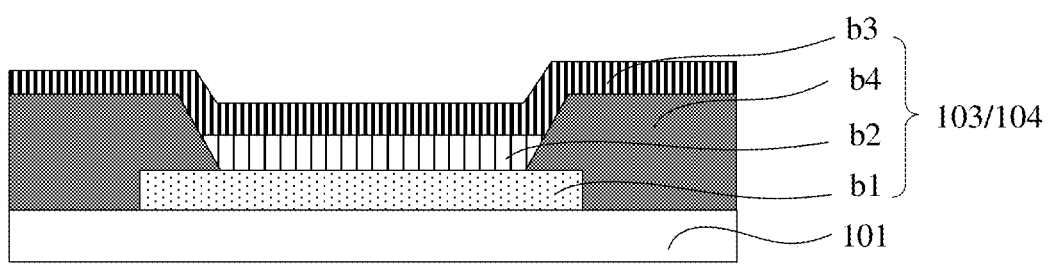
FIG. 10 is a schematic structural diagram of a light-emitting element according to some embodiments of the present disclosure.

In some embodiments of the present disclosure, referring to FIG. 10, a first light-emitting element 103 includes a first electrode b1, a light-emitting pattern b2, and a second electrode b3 which are sequentially stacked in a direction away from a base substrate 101. One end of each connection trace 105 disposed in the first display region 101a is connected to the first electrode b1 in one of the first light-emitting elements 103. Also, the first light-emitting element 103 further includes a pixel definition layer b4 being provided with a hollow-out region therein, and the hollow-out region is used to expose at least a portion of the first electrode b1, such that the first electrode b1 can contact with the light-emitting pattern b2. The first electrode b1 is an anode, and the second electrode b3 is a cathode.

In some embodiments, referring to FIGS. 8 and 9, a display panel 10 further includes: a plurality of first connection structures 108 and a plurality of second connection structures 109. The plurality of first connection structures 108 are disposed in the first display region 101a, and the plurality of second connection structures 109 are disposed in the second display region 101b. The plurality of first connection structures 108 and the plurality of second connection structures 109 are all disposed on a same layer as the plurality of connection traces 105. That is, the plurality of first connection structures 108, the plurality of second connection structures 109 and the plurality of connection traces 105 are made of a same material and manufactured by the same patterning process.

The first pixel circuit 1021, the plurality of connection traces 105 and the first light-emitting element 103 are stacked in a direction away from the base substrate 101. Thus, the plurality of first connection structures 108 and the plurality of second connection structures 109 are disposed between the first pixel circuit 1021 and the first light-emitting element 103. In some embodiments, the plurality of connection traces 105 are disposed on the same layer as a conductive film layer in the first pixel circuit 1021, for example, the plurality of connection traces 105 may be disposed on a conductive film layer on a side of a source-drain layer proximal to the base substrate 101, or the plurality of connection traces 105 may be disposed on the source-drain layer, or on the gate layer. In the case that the plurality of connection traces 105 are disposed on the source-drain layer, the source-drain layer is made of transparent conductive material (e.g., ITO). In the case that the plurality of connection traces 105 are disposed on the gate layer, the gate layer is made of transparent conductive material (e.g., ITO).

One end of each connection trace 105 disposed in the first display region 101a is connected to the first electrode b1 in one of the first light-emitting elements 103 through one of the first connection structures 108, and the other end of each connection trace 105 disposed in the second display region 101b is connected to the first pixel circuit 1021 in one of the first pixel circuit groups 102 through one of the second connection structures 109. That is, one end of each connection trace 105 disposed in the first display region 101a is connected to one of the first connection structures 108, and the first connection structure 108 can be connected to the first electrode b1 in one of the first light-emitting elements 103. The other end of each connection trace 105 disposed in the second display region 101b is connected to one of the second connection structures 109, and the second connection structure 109 is connected to the first pixel circuit 1021 in one of the first pixel circuit groups 102.

In some embodiments of the present disclosure, a first insulating layer is provided between the first pixel circuit 1021 and the connection trace 105, and a second insulating layer is provided between the connection trace 105 and the first electrode b1 in the first light-emitting element 103. The first insulating layer is provided with a first via therein, an orthographic projection of the first via onto the base substrate 101 at least partially overlaps with an orthographic projection of the second connection structure 109 onto the base substrate 101. That is, the second connection structure 109 is connected to the first pixel circuit 1021 through the first via. Also, the second insulating layer is provided with a second via therein, an orthographic projection of the second via onto the base substrate 101 at least partially overlaps with an orthographic projection of the first connection structure 108 onto the base substrate 101. That is, the first connection structure 108 is connected to the first electrode b1 in the first light-emitting element 103 through the second via.

Since the plurality of first connection structures 108 and the plurality of second connection structures 109 are all disposed on the same layer as the plurality of connection traces 105, for each connection trace 105, one first connection structure 108 connected to the connection trace 105, one second connection structure 109 connected to the connection trace 105, and the connection trace 105 are integrated.

In addition, the display panel 10 further include a plurality of third connection structures 110. The plurality of third connection structures 110 are disposed in the second display region 101b. The second light-emitting element 104 has the same structure as the first light-emitting element 103, and includes the first electrode b1, the light-emitting pattern b2, and the second electrode b3 which are sequentially stacked in a direction away from the base substrate 101. The plurality of third connection structures 110 and the plurality of connection traces 105 are disposed on the same layer. That is, the plurality of third structures 110 and the plurality of connection traces 105 are made of the same material and manufactured by the same patterning process.

The second pixel circuit 1022, the plurality of third connection structures 110, and the second light-emitting element 104 are stacked in a direction away from the base substrate 101. That is, the plurality of third connection structures 110 are disposed between the second pixel circuits 1022 and the second light-emitting element 104. In some embodiments, the plurality of third connection structures 110 are disposed on the same layer as the conductive film layer in the second pixel circuit 1022, for example, the plurality of third connection structures 110 are disposed on the conductive film layer on a side proximal to the base substrate 101, of the source-drain layer, or the plurality of third connection structures 110 are disposed on the source-drain layer, or on the gate layer. In the case that the plurality of third connection structures 110 are disposed on the source-drain layer, a material of the source-drain layer may be the transparent conductive material (e.g., ITO). In the case that the plurality of third connection structures 110 are disposed on the gate layer, the material of the gate layer may be the transparent conductive material (e.g., ITO).

The first electrode b1 in each second light-emitting element 104 and one second pixel circuit 1022 are connected by one third connection structure 110. That is, the first electrode b1 of each second light-emitting element 104 is connected to one third connection structure 110, and the third connection structure 110 is connected to one second pixel circuit 1022.

In some embodiments of the present disclosure, the second pixel circuit 1022 and the first pixel circuit 1021 can be manufactured together. Thus, the first insulating layer is also provided between the second pixel circuit 1022 and the connection trace 105, and the second insulating layer is also provided between the connection trace 105 and the first electrode b1 in the second light-emitting element 104. The first insulating layer is provided with a third via therein, an orthographic projection of the third via onto the base substrate 101 at least partially overlaps with an orthographic projection of the third connection structure 110 onto the base substrate 101. That is, the third connection structure 110 is connected to the second pixel circuit 1022 through the third via. Also, the second insulating layer is provided with a fourth via therein, an orthographic projection of the fourth via onto the base substrate 101 at least partially overlaps with an orthographic projection of the third connection structure 110 onto the base substrate 101. That is, the third connection structure 110 is connected to the first electrode b1 in the second light-emitting element 104 through the fourth via.

In some embodiments of the present disclosure, the plurality of connection traces 105 include a plurality of first layer connection traces and a plurality of second layer connection traces. The display panel 10 further includes an insulating layer (e.g., referred to as a third insulating layer) between the plurality of first layer connection traces and the plurality of second layer connection traces. Among the plurality of first light-emitting elements 103, a portion of the first light-emitting elements 103 are connected to the first layer connection traces, and another portion of the first light-emitting elements 103 are connected to the second layer connection traces.

In the case that the number of the connection traces 105 is large, the plurality of connection traces 105 can be arranged through two trace layers, which avoids the small distance between adjacent connection traces 105 due to the fact that the number of the connection traces 105 is large, whereby ensuring the reliability of the connection traces 105 for transmitting signals.

In some embodiments, orthographic projections of the plurality of first layer connection traces onto the base substrate 101 is alternately arranged with orthographic projections of the plurality of second layer connection wires onto the base substrate 101. Since the first layer connection traces and the second layer connection traces are alternately arranged, a distance between two adjacent connection traces 105 which are disposed on a same layer is large enough, thereby ensuring the reliability of transmitting signals.

In some embodiments, the plurality of connection traces 105 further include connection traces 105 in more layers, and the insulating layer is disposed between two adjacent layers of connection traces 105, which does not limit the number of layers of connection traces 105 in the embodiments of the present disclosure.

In summary, the embodiments of the present provide a display panel in which each first pixel circuit group includes at most six second pixel circuits for supplying the driving signal to the second light-emitting elements in the second display region, such that one first pixel circuit for supplying the driving signal to the first light-emitting elements in the first display region can be provided in the region of every at most six second pixel circuits in the second display region. Therefore, the length of the connection trace for connecting the first pixel circuit and the first light-emitting element can be shorter, thereby improving the reliability of the connection trace for transmitting signals and ensuring the display effect of the display panel.

Figure 11:
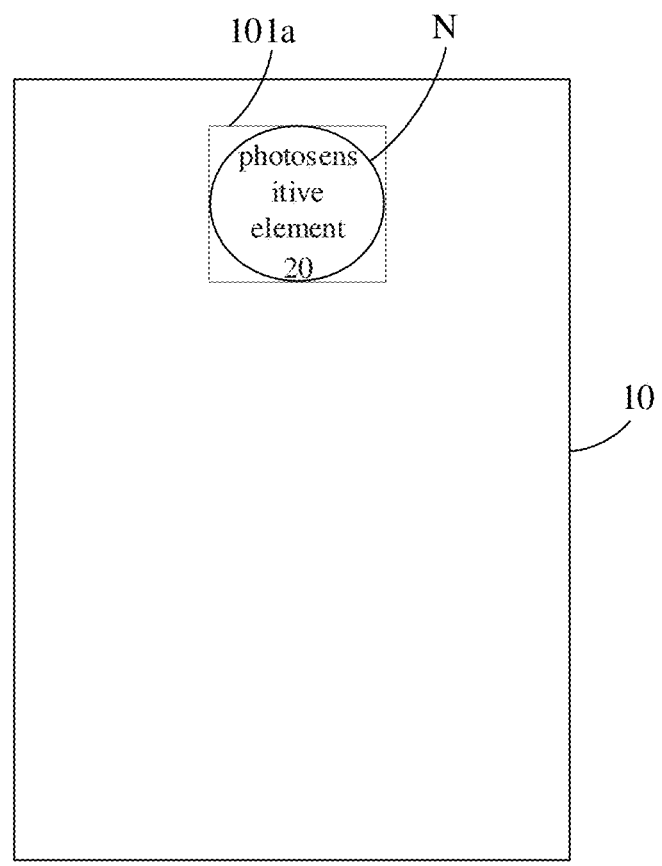
FIG. 11 is a schematic structural diagram of a display device according to some embodiments of the present disclosure.

FIG. 11 is a schematic structural diagram of a display device according to some embodiments of the present disclosure. Referring to FIG. 11, the display device includes a photosensitive element 20, and the display panel 10 as provided in the above embodiments. The photosensitive element 20 is disposed in the first display region 101a of the display panel.

The first display region 101a is rectangular as indicated in FIG. 11, and the area of an orthogonal projection of the photosensitive element 20 onto the base substrate 101 is equal to or smaller than the area of the inscribed circle of the first display region 101a. That is, the size of the region where the photosensitive element 20 is disposed is smaller than or equal to the size of the inscribed circle of the first display region 101a. For example, referring to FIG. 11, as indicated in the display panel 10, the size of the region where the region where the photosensitive element 20 is disposed is equal to that of the inscribed circle N of the first display region 101a, that is, the region where the photosensitive element 20 is disposed is in circular shape, and accordingly, the region where the photosensitive element 20 is disposed is referred to as a light-transmitting hole. In some embodiments, in some embodiments, the first display region 101a is in other shapes besides rectangular, such as circular.

In some embodiments, the photosensitive element 20 is a camera.

In some embodiments of the present disclosure, the display device is any product or component having a display function, such as an active-matrix organic light-emitting diode (AMOLED) display device, a passive-matrix organic light-emitting diode (PMOLED) display device, a quantum dot light-emitting diode (QLED) display device, an electronic paper, a mobile phone, a tablet computer, a television, a display, a notebook computer, a digital photo frame, or a navigator.

The terms used in the embodiments section of the present disclosure are for the purpose of explaining the embodiments of the disclosure only and are not intended to limit the present disclosure. Unless otherwise defined, technical or scientific terms used in the embodiments of the present disclosure should have the ordinary meaning as understood by a person of ordinary skill in the art to which the present disclosure belongs.

The terms "first," "second," "third," and the like, as used in the description and in the claims of the present disclosure, do not denote any order, quantity, or importance, but rather are used to distinguish one element from another. Similarly, similar words such as "one" or "a", etc. do not denote a limitation of quantity, but rather denote the presence of at least one. The word "include" or "contain", and the like, means that the element or item appearing in front of the word "include" or "contain" covers the element or item listed after the word "include" or "contain" and its equivalents, and does not exclude other elements or items. The term "connection" or "connected to" and the like are not restricted to physical or mechanical connections, but may include electrical connections, whether direct or indirect. "Up", "down", "left", "right", and the like are used merely to indicate relative positional relationships, which may also change accordingly when the absolute position of the object being described changes.

The foregoing descriptions are merely optional embodiments of the present disclosure, and are not intended to limit the present disclosure. Within the spirit and principles of the present disclosure, any modifications, equivalent substitutions, improvements, etc., are within the protection scope of the present disclosure.

What is claimed is:

1. A display panel, comprising:
a base substrate provided with a first display region and a second display region, wherein the second display region at least partially surrounds the first display region;
a plurality of first pixel circuit groups arrayed in the second display region, wherein each of the first pixel circuit groups comprises one first pixel circuit and at most six second pixel circuits, and the first pixel circuit and the at most six second pixel circuits arranges along a row direction of the display panel;
a plurality of first light-emitting elements disposed in the first display region;

a plurality of second light-emitting elements disposed in the second display region, wherein the plurality of second light-emitting elements are in one-to-one correspondence with the second pixel circuits in the plurality of first pixel circuit groups, and each second light-emitting element is connected to one of the second pixel circuits corresponding to the second light-emitting element; and a plurality of connection traces extending along the row direction, wherein one end of each of the connection traces is disposed in the first display region and connected to one of the first light-emitting elements, and the other end of each of the connection traces is disposed in the second display region and connected to the first pixel circuit of one of the first pixel circuit groups.

2. The display panel according to claim 1, wherein each of the first pixel circuit groups comprises an even number of the second pixel circuits.

3. The display panel according to claim 2, wherein the second pixel circuit in each of the first pixel circuit groups comprises a plurality of first-type second pixel circuits and a plurality of second-type second pixel circuits;

wherein a number of the first-type second pixel circuits is the same as a number of the second-type second pixel circuits, and for each first pixel circuit group, the first pixel circuit is disposed between the plurality of first-type second pixel circuits and the plurality of second-type second pixel circuits.

4. The display panel according to claim 3, wherein the base substrate is further provided with a third display region, and the third display region is disposed on a side, distal from the first display region, of the second display region; and the display panel further comprises:

a plurality of second pixel circuit groups disposed in the third display region, wherein the second pixel circuit groups comprises third pixel circuits; and a plurality of third light-emitting elements disposed in the third display region, wherein the plurality of third light-emitting elements are in one-to-one correspondence with the third pixel circuits in the plurality of second pixel circuit groups, and each third light-emitting element is connected to one of the third pixel circuits corresponding to the third light-emitting element;

wherein a number of the third pixel circuits comprised by each of the second pixel circuit groups is the same as a number of the first-type second pixel circuits comprised by one of the first pixel circuit groups.

5. The display panel according to claim 4, wherein a color of light emitted from the third light-emitting element connected to the third pixel circuit comprised by the second pixel circuit group is the same as a color of light emitted from the second light-emitting element connected to the first-type second pixel circuit comprised by one of the first pixel circuit groups; or the color of the light emitted by the third light-emitting element connected to the third pixel circuit comprised by the second pixel circuit group is the same as a color of the light emitted by the second light-emitting element connected to the second-type second pixel circuit comprised by one of the first pixel circuit groups.

6. The display panel according to claim 4, wherein the third display region is stripe-shaped, and extends along a column direction of the display panel.

7. The display panel according to claim 2, wherein each of the first pixel circuit groups comprises four of the second pixel circuits.

8. The display panel according to claim 1, wherein the first display region is disposed in a middle of the substrate base in the row direction; the second display region comprises a first sub-region and a second sub-region; the first sub-region and the second sub-region are disposed on both sides of the first display region in the row direction respectively;

wherein, in the plurality of first pixel circuit groups, a number of one row of first pixel circuit groups disposed in the first sub-region is the same as a number of one row of first pixel circuit groups disposed in the second sub-region.

9. The display panel according to claim 8, wherein the plurality of connection traces comprise a plurality of first-type connection traces and a plurality of second-type connection traces;

one end of each first-type connection trace connected to the first pixel circuit is disposed in the first sub-region, and one end of each second-type connection trace connected to the first pixel circuit is disposed in the second sub-region;

wherein the plurality of first connection traces and the plurality of second connection traces are in one-to-one correspondence, and a length of each first connection trace along the row direction is equal to a length of the second connection trace corresponding to the first connection trace along the row direction.

10. The display panel according to claim 1, wherein the first pixel circuit of a target first pixel circuit group in the plurality of first pixel circuit groups is configured to be connected to a power supply terminal for supplying a power supply signal of a fixed voltage to the first pixel circuit;

wherein the first pixel circuit of the target first pixel circuit group is not connected to the first light-emitting element.

11. The display panel according to claim 1, wherein the first light-emitting element comprises a first electrode, a light-emitting pattern and a second electrode which are sequentially stacked in a direction away from the base substrate; and one end of each of the connection traces disposed in the first display region is connected to the first electrode in one first light-emitting element.

12. The display panel according to claim 11, wherein the display panel further comprises: a plurality of first connection structures and a plurality of second connection structures, wherein the plurality of first connection structures are disposed in the first display region and the plurality of second connection structures are disposed in the second display region;

wherein the plurality of first connection structures and the plurality of second connection structures are all disposed on a same layer as the plurality of connection traces, the end, disposed in the first display region, of each of the connection traces is connected to the first electrode in one of the first light-emitting elements by one of the first connection structures, and the other end, disposed in the second display region, of each of the connection traces is connected to the first pixel circuit in one of the first pixel circuit groups by one of the second connection structures.

13. The display panel according to claim 12, wherein for each connection trace, one first connection structure connected to the connection trace, one second connection structure connected to the connection trace and the connection trace are integrated.

14. The display panel according to claim 1 wherein the display panel further comprises a plurality of third connection structures, the plurality of third connection structures being disposed in the second display region; the second light-emitting element comprises a first electrode, a light-emitting pattern, and a second electrode which are sequentially stacked in a direction away from the base substrate; and the plurality of third connection structures and the plurality of connection traces are disposed on a same layer, and the first electrode in each the second light-emitting element is connected to one of the second pixel circuits by one of the third connection structures.

15. The display panel according to claim 1, wherein the connection trace is made of transparent conductive material.

16. The display panel according to claim 15, wherein the transparent conductive material is indium tin oxide.

17. The display panel according to claim 1, wherein the plurality of connection traces comprises a plurality of first layer connection traces and a plurality of second layer connection traces; the display panel further comprises: an insulating layer between the plurality of first layer connection traces and the plurality of second layer connection traces; and among the plurality of first light-emitting elements, a part of the first light-emitting elements are connected to the first layer connection traces, and the other part of the first light-emitting elements are connected to the second layer connection traces.

18. The display panel according to claim 17, wherein orthographic projections of the plurality of first layer connection traces onto the substrate base are alternately arranged with orthographic projections of the plurality of second layer connection traces onto the substrate base.

19. A display device, comprising a photosensitive element, and a display panel; wherein the display panel comprises a base substrate provided with a first display region and a second display region, wherein the second display region at least partially surrounds the first display region; a plurality of first pixel circuit groups arrayed in the second display region, wherein each of the first pixel circuit groups comprises one first pixel circuit and at most six second pixel circuits, and the first pixel circuit and the at most six second pixel circuits arranges along a row direction of the display panel; a plurality of first light-emitting elements disposed in the first display region; a plurality of second light-emitting elements disposed in the second display region, wherein the plurality of second light-emitting elements are in one-to-one correspondence with the second pixel circuits in the plurality of first pixel circuit groups, and each second light-emitting element is connected to one of the second pixel circuits corresponding to the second light-emitting element: and a plurality of connection traces extending along the row direction, wherein one end of each of the connection traces is disposed in the first display region and connected to one of the first light-emitting elements, and the other end of each of the connection traces is disposed in the second display region and connected to the first pixel circuit of one of the first pixel circuit groups;

wherein the photosensitive element is disposed in the first display region of the display panel.

20. The display device according to claim 19, wherein the photosensitive element is a camera.

* * * * *